United States Patent
Cowley

(10) Patent No.: US 12,126,919 B2
(45) Date of Patent: Oct. 22, 2024

(54) METHODS FOR MITIGATING LAG IN IMAGE SENSOR DEVICES

(71) Applicant: SEMICONDUCTOR COMPONENTS INDUSTRIES, LLC, Phoenix, AZ (US)

(72) Inventor: Nicholas Paul Cowley, Wroughton (GB)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 91 days.

(21) Appl. No.: 18/160,814

(22) Filed: Jan. 27, 2023

(65) Prior Publication Data

US 2024/0259701 A1 Aug. 1, 2024

(51) Int. Cl.
*H04N 25/40* (2023.01)
*H04N 1/21* (2006.01)

(52) U.S. Cl.
CPC ........... *H04N 25/40* (2023.01); *H04N 1/2129* (2013.01)

(58) Field of Classification Search
CPC ........... H04N 25/40–46; H04N 1/2129; H04N 1/2133
See application file for complete search history.

(56) References Cited

U.S. PATENT DOCUMENTS

| | | | |
|---|---|---|---|
| 5,530,238 A | 6/1996 | Meulenbrugge et al. | |
| 2005/0030402 A1 | 2/2005 | Agranov et al. | |
| 2011/0285694 A1* | 11/2011 | Shiohara | H04N 23/665 |
| | | | 345/214 |
| 2011/0292236 A1* | 12/2011 | Shiohara | H04N 25/61 |
| | | | 348/222.1 |
| 2014/0340154 A1 | 11/2014 | Lin | |
| 2018/0234648 A1* | 8/2018 | Liobe | H04N 25/626 |

OTHER PUBLICATIONS

Mail et al., "Lag correction model and ghosting analysis for an indirection-conversion flat-panel imager," J. App. Clinical Med. Phys., V. 8, No. 3, (Summer 2007).

* cited by examiner

*Primary Examiner* — Twyler L Haskins
*Assistant Examiner* — Akshay Trehan
(74) *Attorney, Agent, or Firm* — Adam R. Stephenson, LTD.

(57) ABSTRACT

Implementations of a method of mitigating lag for an image sensor device may include reading a row of data from an Nth frame of image data from an image sensor device; correcting the row of data using truncated row data from an N−1th frame stored in a memory operatively coupled with the image sensor device to form a lag corrected row of data; outputting the lag corrected row of data; truncating the row of data to form truncated row data from the Nth frame; and storing the truncated row data from the Nth frame in the memory.

20 Claims, 15 Drawing Sheets

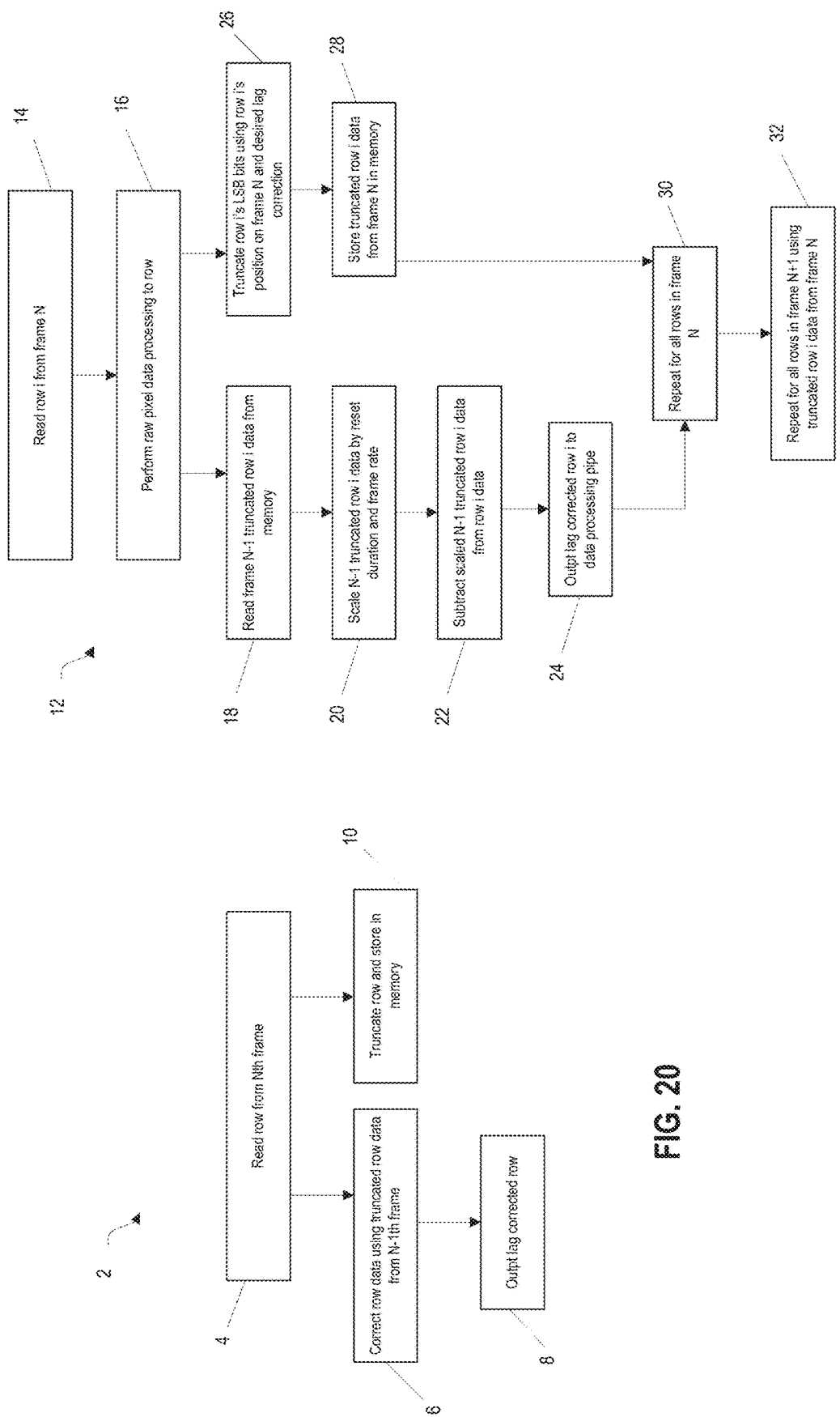

METHODS FOR MITIGATING LAG IN IMAGE SENSOR DEVICES

BACKGROUND

1. Technical Field

Aspects of this document relate generally to electromagnetic sensing devices, such as image sensors.

2. Background

Electromagnetic sensing devices have been devised that allow for the conversion of electromagnetic radiation into electrical signals. Electromagnetic sensing device packages have been devised that allow the electrical signals to be sent for further processing and use.

SUMMARY

Implementations of a method of mitigating lag for an image sensor device may include reading a row of data from an Nth frame of image data from an image sensor device; correcting the row of data using truncated row data from an N−1th frame stored in a memory operatively coupled with the image sensor device to form a lag corrected row of data; outputting the lag corrected row of data; truncating the row of data to form truncated row data from the Nth frame; and storing the truncated row data from the Nth frame in the memory.

Implementations of a method of mitigating lag for an image sensor device may include one, all, or any of the following:

The method may include applying dithering to the row of data before truncating the row of data.

The method may include performing raw pixel data processing with the row of data.

The method may include wherein scaling the row of data using the truncated row data from the N−1th frame further may include subtracting the truncated row data from the N−1th frame from the row of data.

The method may include wherein scaling the row of data using the truncated row data from the N−1th frame further may include scaling the truncated row data from the N−1th frame using a reset duration and frame rate.

The method further may include applying dithering to the truncated row data.

The method may further include wherein truncating the row of data further may include truncating using a truncating number based on a value for a group of pixels.

The method may include multiplying the value for the group of pixels by 2i where i may be an integer greater than zero.

Implementations of a method of mitigating lag for an image sensor device may include reading a row of data from an Nth frame of image data from an image sensor device; performing raw pixel data processing to the row of data; reading a truncated row of data from an N−1th frame of image data from a memory operatively coupled with the image sensor device; and scaling the truncated row of data using reset duration and frame rate to form a scaled truncated row of data. The method may include subtracting the scaled truncated row of data from the row of data to form lag corrected row data; outputting the lag corrected row of data; truncating the row of data to form truncated row data from the Nth frame; and storing the truncated row data from the Nth frame in the memory.

Implementations of a method of mitigating lag for an image sensor device may include one, all, or any of the following:

The row of data in Nth frame may have a row number that may be the same as a row number of the truncated row of data from the N−1th frame.

The method may include wherein truncating the row of data further may include truncating the row of data's least significant bits using a position of the row in the Nth frame and a desired lag correction.

The method may include applying dithering to the row of data before truncating the row of data.

The method may include applying dithering to the truncated row data after scaling the truncated row of data.

The method may include wherein truncating the row of data further may include truncating using a truncating number based on a value for a group of pixels.

The method may include multiplying the value for the group of pixels by 2i where i may be an integer greater than zero.

The method may include wherein truncating the row of data to form truncated row data from the Nth frame may include truncating until residual most significant bits by row position equal zero.

Implementations of a method of mitigating lag for an image sensor device may include setting a row number to zero for a first frame of image data; reading a row of data from the first frame of image data from an image sensor device; performing raw pixel data processing to the row of data; truncating the row of data to form truncated row data from the first frame; and storing the truncated row data from the first frame in a memory operatively coupled with the image sensor device.

Implementations of a method of mitigating lag for an image sensor device may include one, all, or any of the following:

The method may include, for a second frame: reading a row of data from the second frame of image data; performing raw pixel data processing to the row of data; reading the truncated row of data from the first frame of image data from the memory; scaling the truncated row of data using reset duration and frame rate to form a scaled truncated row of data; subtracting the scaled truncated row of data from the row of data from the second frame of image data to form lag corrected row data; outputting the lag corrected row of data; truncating the row of data to form truncated row data from the second frame; and storing the truncated row data from the second frame in the memory.

The method may include repeating the processes for all rows in the first frame of image data except for setting the row number to zero for the first frame.

The method may include repeating the processes for all rows in the second frame of image data.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 20 is a flow chart of a first implementation of a method of mitigating lag;

FIG. 21 is a flow chart of a second implementation of a method of mitigating lag;

DESCRIPTION

Figure 1:
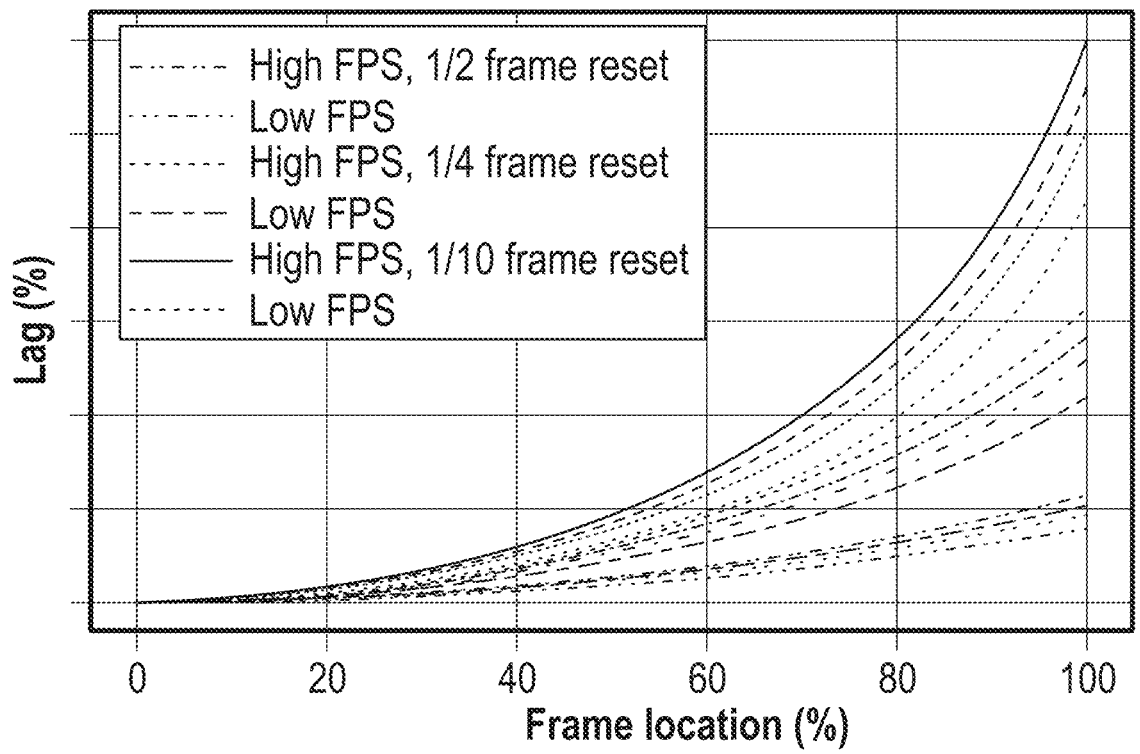
FIG. 1 is graph of lag percentage by percent location in a frame at various frame rates and frame reset values.

This disclosure, its aspects and implementations, are not limited to the specific components, assembly procedures or method elements disclosed herein. Many additional components, assembly procedures and/or method elements known in the art consistent with the intended systems and methods for mitigating lag will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such systems and methods for mitigating lag, and implementing components and methods, consistent with the intended operation and methods.

Various electromagnetic radiation sensors have been devised to detect any of a wide variety of electromagnetic radiation types, including, by non-limiting example, x-ray, ultraviolet, visible, infra-red, microwave, and any other electromagnetic radiation type. In this document, electromagnetic radiation sensors are referred to as image sensors as the sensors disclosed herein contain an array of pixels used to create a two-dimensional electrical representation of the electromagnetic radiation incident on the image sensor. Many image sensors like those disclosed herein are used to form video signals that are formed by collecting a series of sequential two-dimensional electrical representations of images of the incident electromagnetic radiation on the pixels of the sensor, each in the form of a frame of electrical data. Because the pixels are arranged in rows in many image sensor designs, each frame of electrical data also contains data from each pixel arranged in a corresponding row. In many image sensor designs, the pixel array is coupled with various read out and processing circuitry designed to collect the electrical data from each pixel, refresh the pixel array, and perform any of a wide variety of other image capture functions. In many image sensors like those disclosed herein, the image sensor data is read out from the pixels one row of pixels at a time; however, other image sensor types where the pixels are read out in other ways, including, by non-limiting example, more than one row at a time, all rows at once, rows read in isolation, rows read in parallel, rows read with other parts of the same or different rows or any other method of reading pixel data can be used with the various method implementations disclosed herein.

Since each pixel is a semiconductor device made of several semiconductor components, the electrical properties/behavior of the pixel and the type of electromagnetic radiation it can detect is determined by the electrical characteristics of the semiconductor components. For example, in some pixel designs, high K dielectric films (those with a dielectric constant K greater than that of silicon dioxide) are employed to help form one or more capacitors for pixels that operate in the voltage domain. The use of the high K materials permits the capacitors to be created at a smaller size than if they were made of silicon dioxide. These one or more capacitors are used to store charge. These capacitors may be used in a wide variety of operational characteristics of the pixel/image sensor including, by non-limiting example, global shutter operation or dual gain operation. Capacitors made using a high K material exhibit an electrical relaxation behavior following a reset where the dielectric continues to relax over time that causes a detectible change in voltage/charge with time.

For image sensors that employ high K dielectric capacitors anywhere in the structure of the pixel or image sensor design, the length of time involved in the relaxation of the dielectric materials means the capacitors may not be fully discharged by the time the collection of the next frame of image data from the pixel array arrives. The magnitude of the retained charge depends on the stored charge in the first frame and the reset duration between the first frame and the second frame. The reset duration can be particularly important because when the capacitor is in reset, charge in the capacitor can still be removed but when reset ends, any charge remaining due to dielectric relaxation is retained in the capacitor and thus "retained" into the second frame. This causes information from the first frame to "lag" into the second frame with a magnitude proportional to an amplitude of the first frame and inversely proportional to the reset duration.

In image sensor designs where the pixel array (that forms a frame of image data) is read out in rows, rows are often read from the top of the pixel array to the bottom of the pixel array (or vice versa) to minimize inter-frame artifacts. In some image sensors, reset is applied to each row of pixels after the row is read, which results in the reset duration for each row decreasing unidirectionally up or down the frame/pixel array. This means that the position of each row of pixels can influence the magnitude of the lag observed from each pixel row. In other words, because the last row of pixels has the shortest reset duration prior to the taking of the second frame of data, it is the row of pixels most likely to show the highest lag into the second frame of data.

FIG. 1 is a graph of lag percentage by frame location as a percent value across the frame. Since in this image sensor implementation, the frame is read from 0% up to 100% of the rows in the frame, the last rows have the lowest reset time and corresponding the highest lag value at any frame read rate (frames per second, FPS). The faster the read rate, the higher the observed lag because the high K dielectric materials are given correspondingly less relaxation time due to the lower reset. For the high FPS array illustrated in FIG. 1, the entire array is held in reset for that fraction of the frame reset defined. As a non-limiting example, for a sensor being operated at 1000 FPS with 12 frame reset, the frame reset indicates that the resultant rate of reading frames is 1000 FPS which gives the total time for processing each frame as 1 millisecond. Within that 1 millisecond the array is held in reset for 12 of that time, i.e. 0.5 millisecond, and so the frame is read in just 0.5 milliseconds. Not surprisingly due the short period of processing time available for each frame, the highest frame rates in FIG. 1 show the highest percentage lag at the 100% position for each frame. In FIG. 1, a high frame rate is at least greater than 800 FPS and a low frame rate is less than 60 FPS. The highest lag is observed on the last rows where the image sensor is being read out at high FPS with $\frac{1}{10}^{th}$ frame reset (the minimum frame reset illustrated in FIG. 1). This makes sense because the array is only held in reset for 10% of the total frame processing time, which is much less time than at 1% or 50% frame reset.

For a pixel device operating at a high FPS with $\frac{1}{10}$ frame reset and where the illumination may correspond to the pixel linear full well (LFW) or a substantial portion thereof, the lag may be unacceptably high for high performance applications, for example, greater than 10 electrons. As can be seen from FIG. 1, increasing the reset time while maintaining the frame rate can reduce the lag-reducing to 1% frame reset can reduce the lag by about 70% in some implementations. While this can result in reducing lag to acceptable levels the actual frame read rate is now substantially reduced leading to a significant electrical power overhead. The method and system implementations disclosed herein work to reduce the lag amplitude without substantially reducing the row time while avoiding creating scene dependent "false corrections" as artifacts. The various implementations disclosed herein work to optimize memory sized used and/or dynamic bit per pixel/pixel kernel allocations.

Referring to FIG. 20, a flow chart of an implementation of a method of mitigating lag 2 is illustrated. As illustrated, the method 2 includes reading a row of image data from an Nth frame (which could be a second frame, last frame, or any frame in between) from the pixel array of an image sensor device (step 4). The row of data is then corrected using truncated row data from an N−1th frame (which is a frame immediately prior in time to the current frame) to form a lag corrected row of data (step 6), and the lag corrected row of data is then output for further processing (step 8). At the same time, in real time, in substantially real time, or simultaneously, the row of data is truncated to form truncated row data and stored in a memory that is operatively coupled with the image sensor (step 10). In some implementations, the memory is physically part of the image sensor, but in others, the memory is included in a semiconductor device physically separate from the image sensor itself (like a digital signal processor device or separate memory). The process illustrated in FIG. 20 is repeated for each row in the Nth frame. The process is then repeated for the N+1th frame where the truncated row data is now from the Nth frame, rather than the N−1th frame. In various implementations, the truncated row data takes the form of a digital number.

Referring to FIG. 21, a flowchart of another implementation of a method of mitigating lag 12 is illustrated. As illustrated, the method includes reading row i (an ith row), row of data from frame N (which may be a second frame, last frame, or any frame in between, step 14). Row i may be a first row, second row, last row, or any row in between. The row of data corresponding to row i may, in particular method implementations, be processed using raw pixel data processing techniques, such as, by non-limiting example, a simple process of storing R and or S (reset and signal) reads of the pixel before digitization, applying a fixed gain to the pixel signal before digitization, applying a signal dependent gain to the pixel before digitization, correlated double sampling (CDS), analog CDS, digital CDS, analog and digital CDS, or any other pixel data processing technique (step 16). In other implementations, however, the method may proceed with reading frame N−1 truncated row I data from memory (step 18, which follows processing of that data as outlined in step 28). In the various method implementations disclosed herein, the truncated row data is from the same row (has the same row number) in each frame as the row of data being processing, which allows for direct row-to-row lag correction. The method includes scaling N−1 truncated row i data using reset duration and frame rate (step 20) and in various implementations the row position in a frame where the position is synonymous with the order the row is read. In a non-limiting example, the scaling of the data is conducted using the formula in Equation 1 below where Row is the row i data, Reset is the reset rate, FPS is the frames per second, Signal is corresponds with illumination level and may, in particular implementations, be expressed as a percentage of LFW. $K_1$-$K_8$ are constants derived from fitting an 8 constant curve to observed lag percentage data:

$$\text{Lag}\% = \frac{Signal K_1 (K_2 \log(\text{Reset}) + K_3)\left(K_4 \log\left(\frac{FPS}{1000}\right) + 1\right)}{K_8} \cdot \frac{(K_5 Row^3 - K_6 Row^2 + K_7 Row^1 + K_8)}{K_8}$$

While in particular implementations a correlation involving reset rate and frame rate is utilized, in other implementations, other correlations with different forms and using reset rate, frame rate, and/or both reset rate and frame rate may be employed. A wide variety of correlation forms and constants may be devised for various image sensor types and designs and operational characteristics in various implementations.

Referring to FIG. 21, following scaling of the N−1 truncated row i data, the scaled truncated row of data is subtracted from the row i data to form lag corrected row i data. In various method implementations, the correction may be full or partial to a predetermined level of acceptability. Subtracting is used to cancel out the retained effect of the un-relaxed voltage that remained in the high k capacitors (step 22). The lag corrected row i data is then output for further processing using a data processing pipe (step 24).

At the same time, simultaneously, substantially simultaneously, in real time, or in substantially real time, the method includes truncating row i's least significant bits (LSB) using row i's position in/on frame N and a desired lag correction (step 26) to form truncated row i data from frame N and storing the truncated row i data in the memory (step 28). Various implementations of methods of truncating and determining the desired lag correction will be discussed later in this document. The method also includes repeating the foregoing processes for all rows in frame N (step 30) and then repeating for all rows in frame N+1 using the truncated row i data from frame N (step 32).

Figure 23:
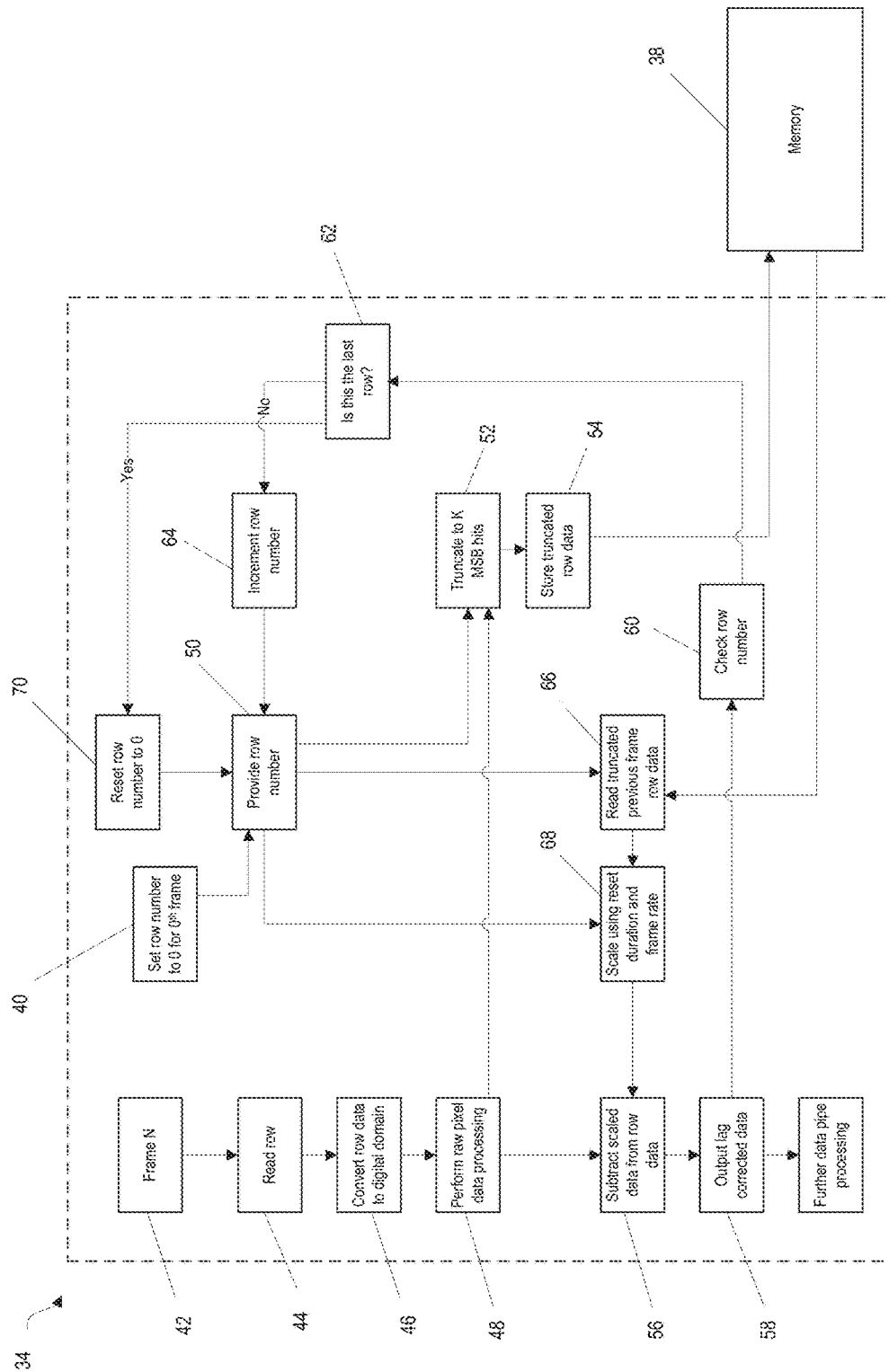
FIG. 23 is a flow chart of a third implementation of a method of mitigating lag.

Referring to FIG. 23, another implementation of a method of mitigating lag 34 is illustrated. In this method implementation, the processes of what happens on the first frame of a plurality of frames is illustrated. These processes may also be used in each of the previously discussed method implementations as well for the first frame. As illustrated, the method 34 can be executed/implemented by a logic/data processing circuit 36 operatively coupled with a memory 38. In various system implementations, the logic/data processing circuit may be a digital logic circuit included in the image sensor or may be a digital logic circuit included in a digital signal processor operatively coupled with the image sensor. In other system implementations, the logic/data processing circuit 36 may be implemented using, by non-limiting example, a processor, a microprocessor, an application-specific integrated circuit (ASIC) a field programmable gate array (FPGA) or other digital logic circuit. In some implementations, various analog circuit components may be incorporated in the logic/data processing circuit to aid in transforming the analog signals from the pixels to the digital domain. The memory in various system implementations may be any of a wide variety of memory types, including, by non-limiting example, random access memory, flash memory, resistive random access memory or any other volatile or non-volatile memory type.

The flow in FIG. 23 begins with setting the row number to zero for the $0^{th}$ frame of image data (when the first frame in a series of frames begins processing, step 40). The method then includes beginning with the $0^{th}$ frame as frame N (step 42) and reading the first row from the frame (step 44). In various method implementations, the method includes converting the row data (row of data) to the digital domain using various analog-to-digital components like analog-to-digital converters (ADCs, step 46). The method may also include performing raw pixel data processing like any disclosed in this document to the first row of data (step 48). Following the processing, the method includes truncating the first row of data to K most significant bits where K is determined using any method of truncation disclosed in this document (step 52). The method also includes storing the truncated row data in the memory 38 (step 54). For the first row and for all rows in the first or $0^{th}$ frame, the processes of subtracting scaled data from the row data (step 56) are not used, as there is no previous frame data stored in the memory to use for each row's data. Instead, the row data is output for further data pipe processing. As there can be no lag in the first frame (as there has been no reset attempted on any of the pixels, lag is not a concern until the second frame, allowing the method to accumulate the truncated row data for the first frame in the memory 38 without causing any image quality degradation as a result.

Following outputting the row data of the first row (step 58), the method includes checking the row number (step 60) and determining if the current row is the last row of data in the frame (step 62). If the row is not the last row, then the method increments the row number (step 64). If it is the last row number, then the method includes resetting the row number to zero (step 70). For the second frame after the first frame, the method includes providing the row number (step 50) to the truncation process for the row and to the process that reads the truncated previous frame's row data (step 66), so the process knows which row to read out of the memory 38. As illustrated in FIG. 23, the truncated row data from the previous frame is scaled using the reset duration and frame rate using any scaling method disclosed herein (step 68) before then being subtracted from the row data of the current frame (step 56). The resulting output lag corrected data is then sent for further data pipe processing (step 58). Note that the row of data being corrected in the Nth frame and the scaled truncated row data used for the subtraction operation have the same row number and the method works to ensure the row numbers correlate throughout the process for all frames.

In the various method implementations previously discussed, the method may include applying dithering to the row of data prior to truncating the row of data. This may be carried out by adding and/or subtracting a random number to the scaled truncated row data or to the row of data prior to truncation in various implementations. The dithering may work to soften transitions in the data across groups of pixels, such as might be associated with an illumination amplitude or color edge in the image. In various method implementations, max and minimum clipping limits may be applied to the lag corrected data to prevent under- or over-drive when the dithering is used.

Figure 22:
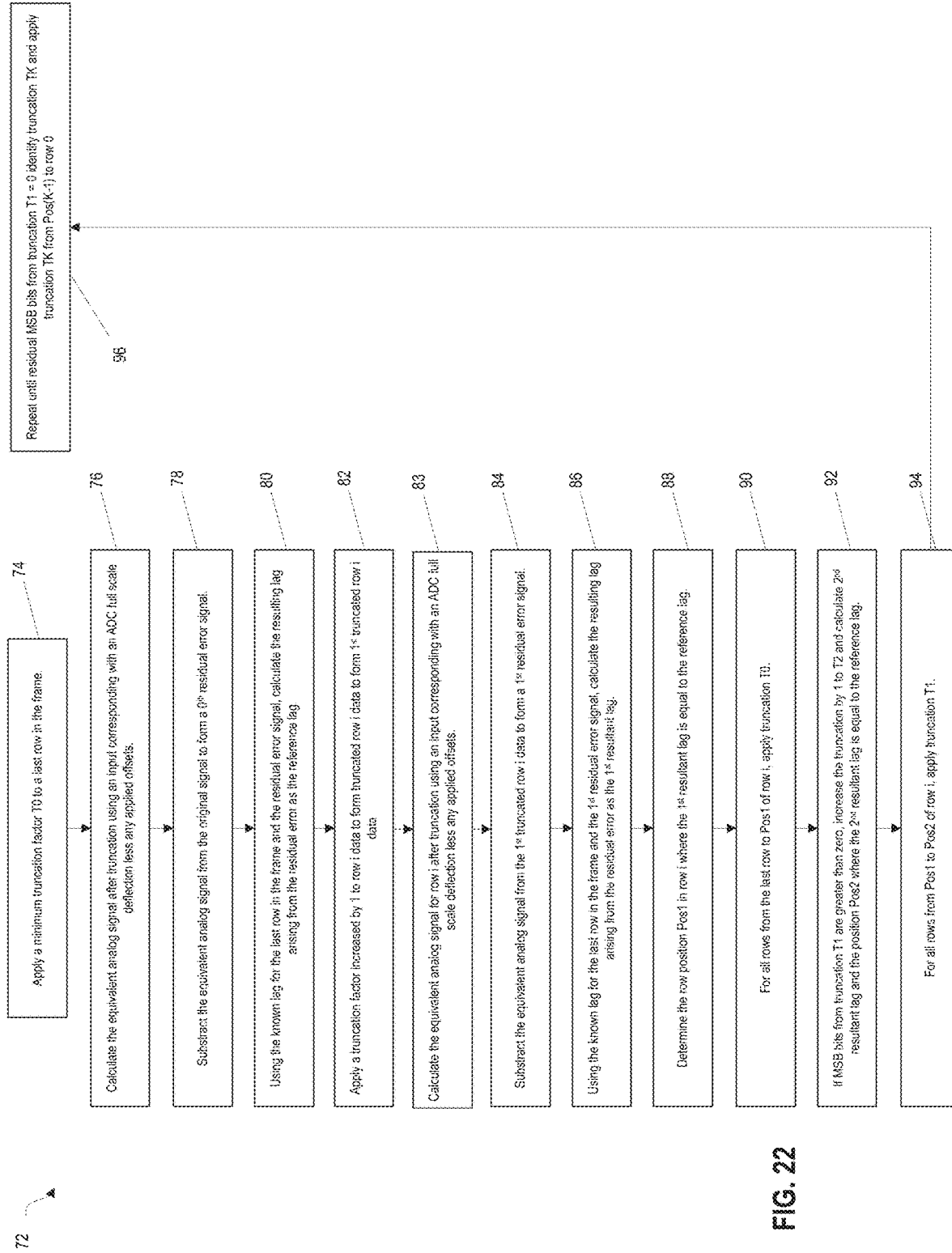
FIG. 22 is a flow chart of an implementation of truncation.

Various methods for carrying out truncation of the row data may be employed in various method implementations. In various truncation methods, the result of the truncation is the generation of a truncated digital number then used in the scaling and subtraction operations; in others the result is a reduced set of row data that is then scaled and used in subtraction operations. Referring to FIG. 22, a flow chart of an implementation of a method of determining a truncation factor by row position 72 is illustrated. The method includes applying a minimum truncation factor T0, e.g. the T0 that will be applied to the last row in the frame, where the lag will be greatest for a uniform illumination frame-wise (step 74). The method then includes calculating the equivalent analog signal after truncation using an input corresponding with an ADC full scale deflection (FSD) less any applied offsets (step 76). The applied offset, by non-limiting example, is used to ensure that in the case of zero illumination of the array the ADC will generate output that is greater than all 0s or, in other words, avoiding ADC clipping at a minimum illumination input. Avoiding ADC clipping is needed to handle any random variations in the zero illumination input voltage levels to the ADC which, if not compensated for, may result in the input level being below all 0s. In various implementations, the applied offset may take the form of a "plateau" or other value corresponding to random variation $S_R$ in a minimum or zero illumination condition of the array experienced by the ADC as an input voltage. The use of the plateau value ensures that the $S_R$ variation will not lead to low input clipping in the ADC conversion of the resulting input voltage signal from the array. The method includes subtracting the equivalent analog signal from the original signal to form a $0^{th}$ residual error signal (step 78). The method also includes using the known lag for the last row in the frame and the residual error signal, calculating the resulting lag arising from the residual error as the reference lag (step 80). The method includes applying a truncation factor increased by 1 to the row i data to form truncated row i data to form $1^{st}$ truncated row i data (step 82). The method includes calculating an equivalent analog signal for the row i data after truncation using an input corresponding with an ADC full scale deflection less any applied offsets (step 83). The applied offsets used in this process may be any disclosed in this document. The method then includes subtracting the equivalent analog signal from the $1^{st}$ original row i signal to form a $1^{st}$ residual error signal (step 84) and then using the known residual error for the last row in the frame, corresponding to the reference lag calculated in step 80 and the $1^{st}$ residual error signal, and calculating the resulting lag arising from the residual error as the $1^{st}$ resultant lag (step 86). The method also includes determining the row position Pos1 in row i where the $1^{st}$ resultant lag is equal to the reference lag (step 88). The method includes for all rows from the last row to Pos1 of row i, applying truncation T0 (step 90), and if most significant bits (MSB) from truncation T1 are greater than zero, increasing the truncation by 1 to T2 and calculating $2^{nd}$ resultant lag and the position Pos2 where the $2^{nd}$ resultant lag is equal to the reference lag (step 92). The method also includes for all rows from Pos1 to Pos2 of row i, applying truncation T1 (step 94) and repeating until residual MSB bits from truncation T1=0 identify truncation TK, then applying truncation TK from Pos(K−1) to row 0 (step 96).

The foregoing is a method of truncation that utilizes residual error to ultimately determining the truncation TK used to minimize the MSB bits of the truncated row data. A wide variety of other truncation methods can be employed and devised using the principles disclosed herein to perform the truncation to produce the desired digital number or set of truncated row data in various implementations.

Various method implementations may employ a method of truncation/correction where instead of generating a truncated digital number for each pixel in frame N−1, the truncated digital number may be generated for a group of pixels such as, by non-limiting example, a 2×2 group, 3×3 group, 4×2 group, or other combination of pixels. In various method implementations, the truncated digital number may be based on, by non-limiting example, the maximum value within the group of pixels, an average value within the group, or another statistic calculated within the group (medial, minimum value, etc.). The value here is the output signal level of each pixel within the group. In particular method implementations, the group of pixels may skip columns or rows of adjacent pixels when a color filter array (CFA) is coupled over the array of pixels to ensure pixels associated with the same color in the CFA are grouped together. In various implementations, the grouping may be asymmetric, meaning that pixels associated with just one color or just two colors in the CFA are grouped and the remaining color(s) may not be grouped. In particular implementations, multiples of the colors may be grouped as well (by non-limiting example, two reds, one blue, and a green may all be grouped together). In these various method implementations, the grouping may be based on position within the frame. In some implementations, these position multiples may include larger groups for earlier rows in the frame and smaller groups for the later rows in the frame allowing for less correction of the earlier rows than for the later rows. This is consistent with the observation that the earlier rows have had increased reset time compared to the later rows in the frame. The advantage of these method implementations that employ grouping is that grouping reduces the memory requirements of the memory for data storage of the truncated row data. If there exists a large transition within a pixel group, spatial frequency filtering may be employed to mitigate any issues caused by the size of the transition. Various combinations of the elements of these method options with any of the previous disclosed method implementations may be constructed in various method implementations.

Other method implementations may include various combinations of the previously disclosed implementations in combination with multiplying the N−1 frame group of pixels by $2^i$ where i is an integer greater than 0. This may be based on the maximum value in various implementations such that the raw digital number used for truncation is maximized, thus minimizing truncation before storage of the truncated row data in the memory. In this implementation, the multiplication factor $2^i$ is stored for each pixel group. The inverse multiplication factor is then applied to the scaled truncation row data that is then subtracted from a corresponding group of pixels in the Nth frame. In various method implementations, the grouping of pixels in the Nth frame may the same group as in the N−1 frame or may be a different grouping than used in the N−1 frame. The advantage of using these method implementations may be that the level of cancellation signal is increased for pixel values less than one-half of the full-scale deflection (FSD) of an ADC used to process the row data as the level of truncation is reduced. This process of multiplying by a power of 2 may also be described as performing a binary multiplication prior to truncation followed with inverse binary multiplication post-scaling of the truncated row data. This may maximize the benefit of the remaining residual MSB correction bits used in subtraction. For example, consider where the transition from 0 to 1-bit residual MSB occurring at 0.5 FSD for an ADC. Without multiplication for signals below 0.5 FSD no cancellation signal is generated, but using the method implementations disclosed in this paragraph, signals below 0.25 and 0.5 FSD the signal can be multiplied by 2 resulting in 1 MSB bit correction or a 0.25 FSD correction being applied via the resulting scaled truncated row data. This may reduce lag by at least 6 dB in this situation.

Figure 2:
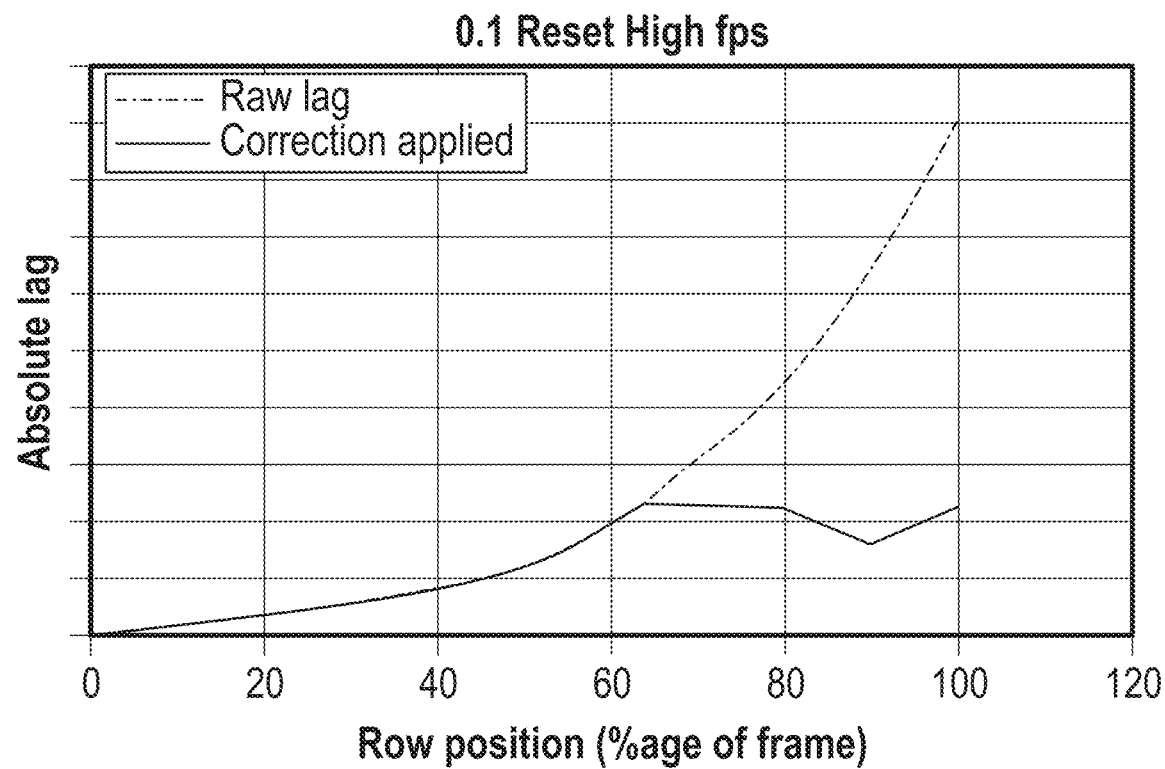
FIG. 2 is a graph of absolute lag versus percent location in a frame for raw lag and for a first corrected signal constructed using the principles disclosed in this document.
Figure 3:
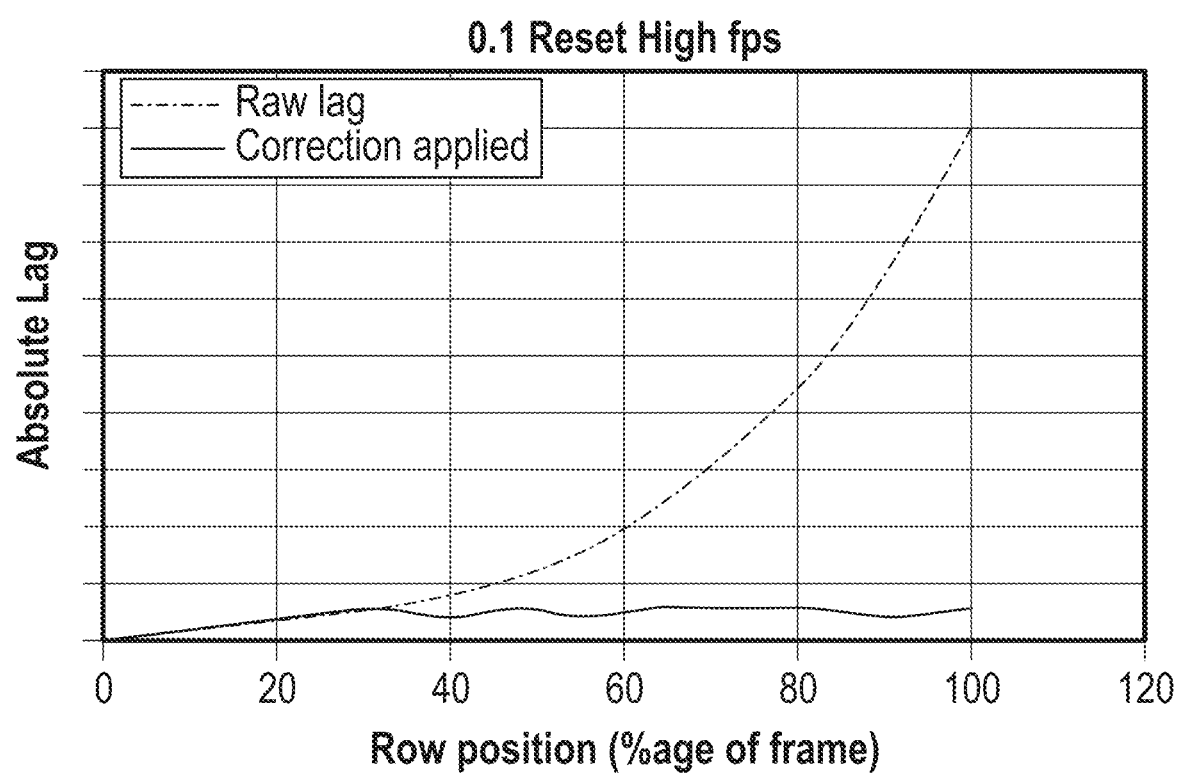
FIG. 3 is a graph of absolute lag versus percent location in a frame for raw lag and for a second corrected signal constructed using the principles disclosed in this document.

An implementation of a method like that illustrated in the flow chart in FIG. 23 was utilized to correct frame data being sampled at high FPS at 10% reset, which previously in FIG. 1 was illustrated to be the worst case. The results are illustrated in the form of graphs of absolute lag versus row position represented by row percent of FIGS. 2-3. In FIG. 2, the original lag is plotted along with a line that represents the use of a first amount of memory at a 10% frame reset. In FIG. 3, the results are illustrated where the lag suppression is used along with four times the amount of memory of that used in FIG. 2 at a 10% frame rate. These graphs show how the method implementations disclosed herein can allow for independent design optimization of memory and frame overhead to achieve a desired absolute lag.

Figure 4:
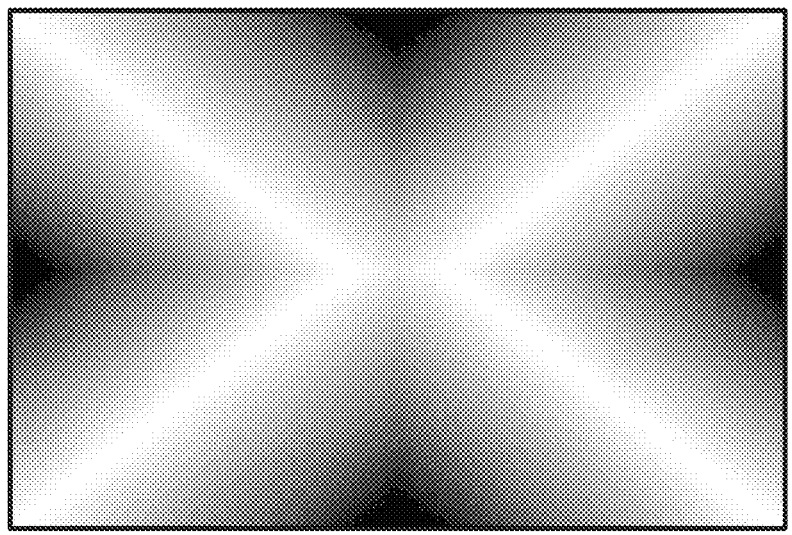
FIG. 4 is an input image with a dynamic range from 0 to 100% of Linear Full Well (LFW)
Figure 5:
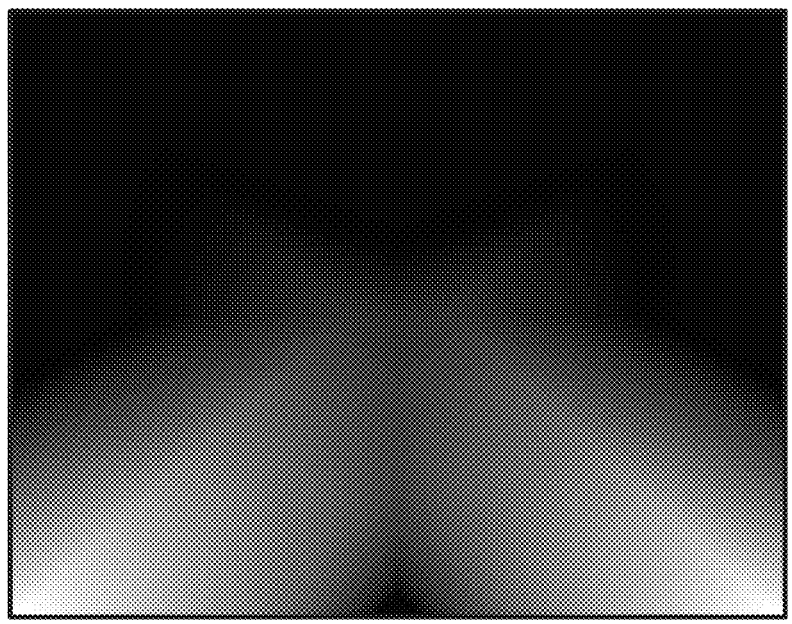
FIG. 5 is an image with uncorrected lag with a dynamic range corresponding to 0 to 0.33% of LFW
Figure 6:
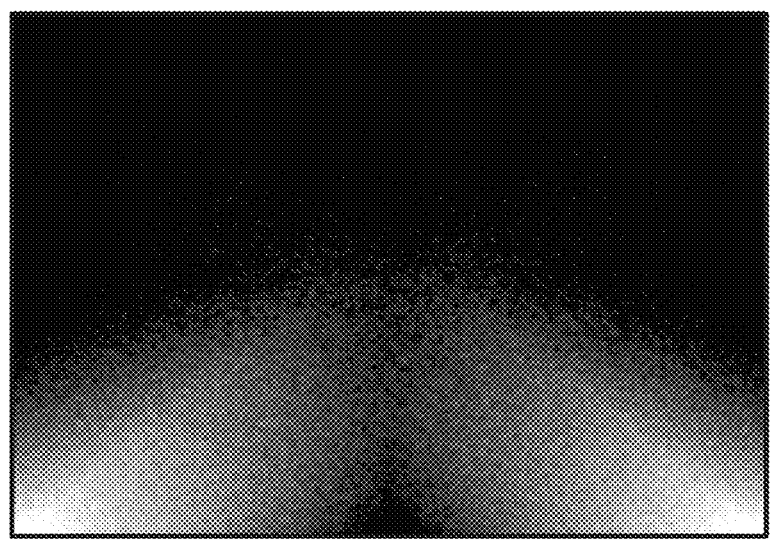
FIG. 6 is an image with uncorrected lag with a dynamic range corresponding to 0 to 0.33% of LFW and with random temporal noise and dithering applied.
Figure 7:
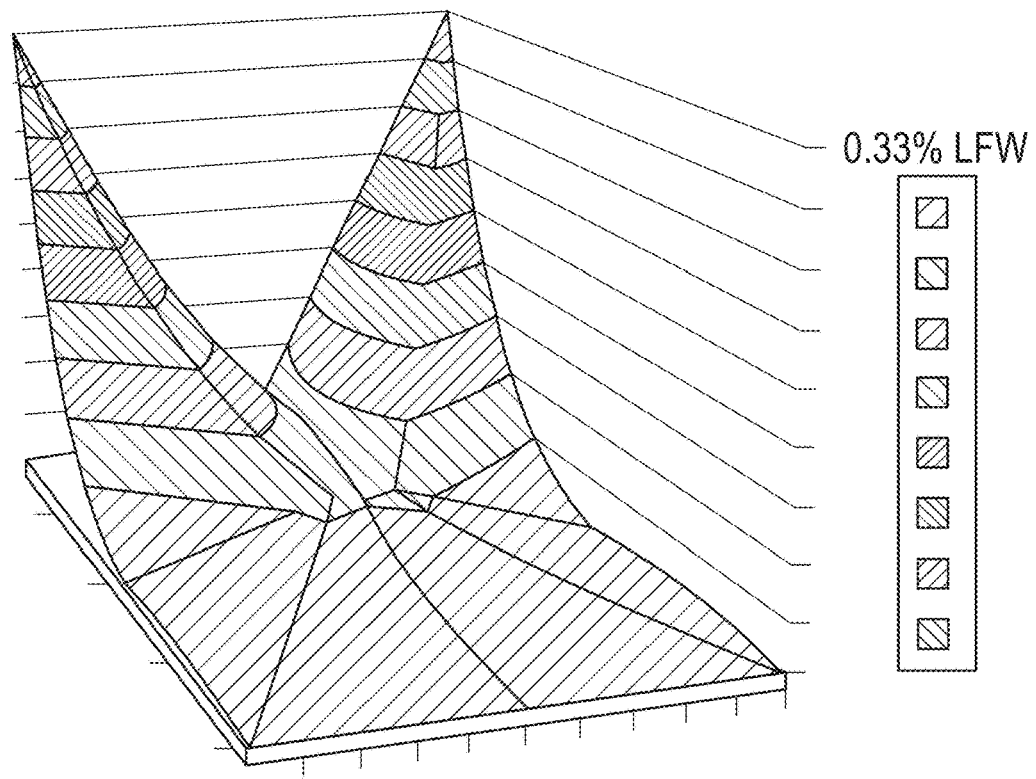
FIG. 7 is a is a three-dimensional graph of absolute lag for the uncorrected lag images of FIG. 5.

Referring to FIG. 4, a reference image is illustrated that was used to illustrate the improvements created by a method implementation for mitigating lag like that illustrated in FIG. 21. This image has a maximum input (white) corresponding to pixel LFW and a dynamic range of 0 to 100% LFW. FIG. 5 is an image showing the effect of uncorrected lag on the reference image with a dynamic range of 0 to 0.33% LFW while FIG. 6 is an image showing the effect of uncorrected lag on the reference image with a dynamic range of 0 to 0.33% LFW and with dithering and $T_N$ (Temporal Noise) applied. FIG. 7 is a three-dimensional graph of the absolute lag for the uncorrected lag image of FIG. 5, For ease of illustration the contrast or dynamic range in FIGS. 5 and 6 were increased 300-fold, i.e., by 50 dB, with respect to FIG. 4.

Figure 8:
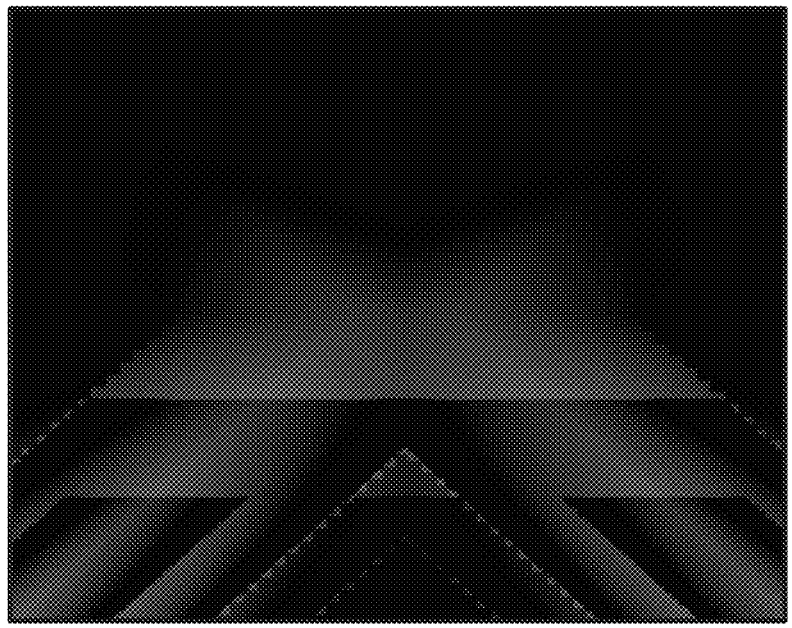
FIG. 8 is an image with a first corrected signal lag with a dynamic range corresponding to 0 to 0.33% of LFW.
Figure 9:
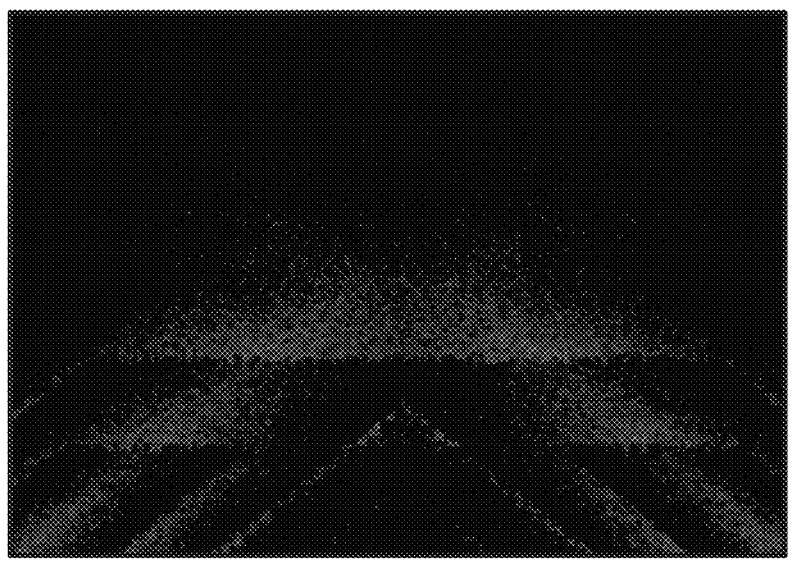
FIG. 9 is an image with a first corrected signal lag with a dynamic range corresponding to 0 to 0.33% of LFW and with random temporal noise and dithering applied.
Figure 10:
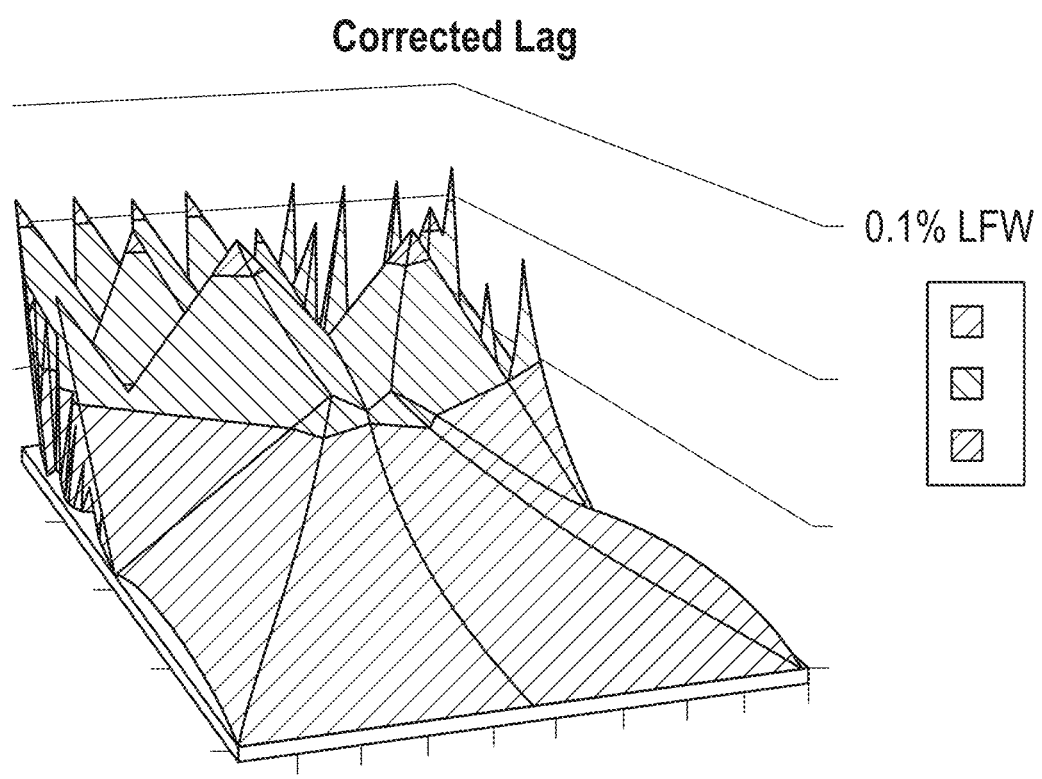
FIG. 10 is a three-dimensional graph of absolute corrected lag for the image of FIG. 9.

FIG. 8 is an image where lag has been corrected with a first correction and with a dynamic range of 0 to 0.33% LFW and FIG. 9 is an image where lag has been corrected with a first correction and with a dynamic range of 0 to 0.33% LFW and with dithering and $T_N$ applied. FIG. 10 is a three-dimensional graph of absolute corrected lag for the image of FIG. 8 relative to $T_N$. The images of FIGS. 8-9 and the three-dimensional graph show more pixel uniformity and less of the shape of the reference image, demonstrating that the lag correction is having a desired effect, particularly at the bottom of the image. Again for ease of illustration the contrast or dynamic range in FIGS. 8-9 were increased 300-fold, i.e., by 50 dB, with respect to FIG. 4.

Figure 11:
FIG. 11 is an image with a second corrected signal lag with a dynamic range corresponding to 0 to 0.33% of LFW.
Figure 12:
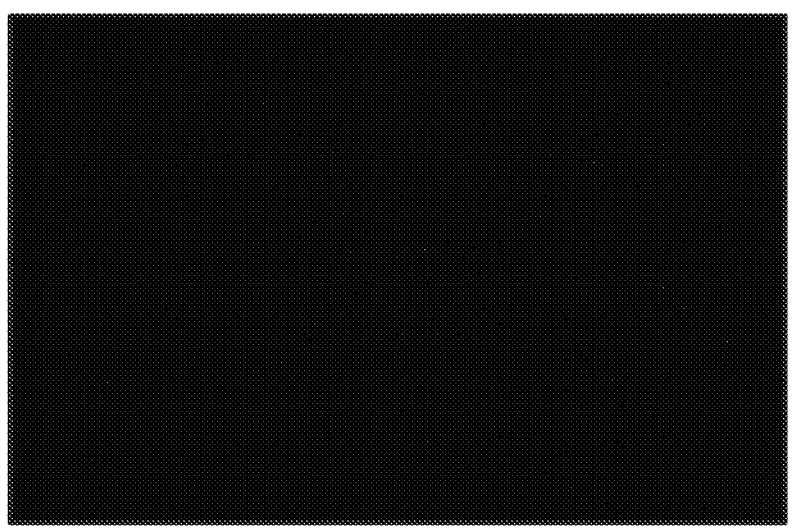
FIG. 12 is an image with a second corrected signal lag with a dynamic range corresponding to 0 to 0.33% of LFW and with random temporal noise and dithering applied.
Figure 13:
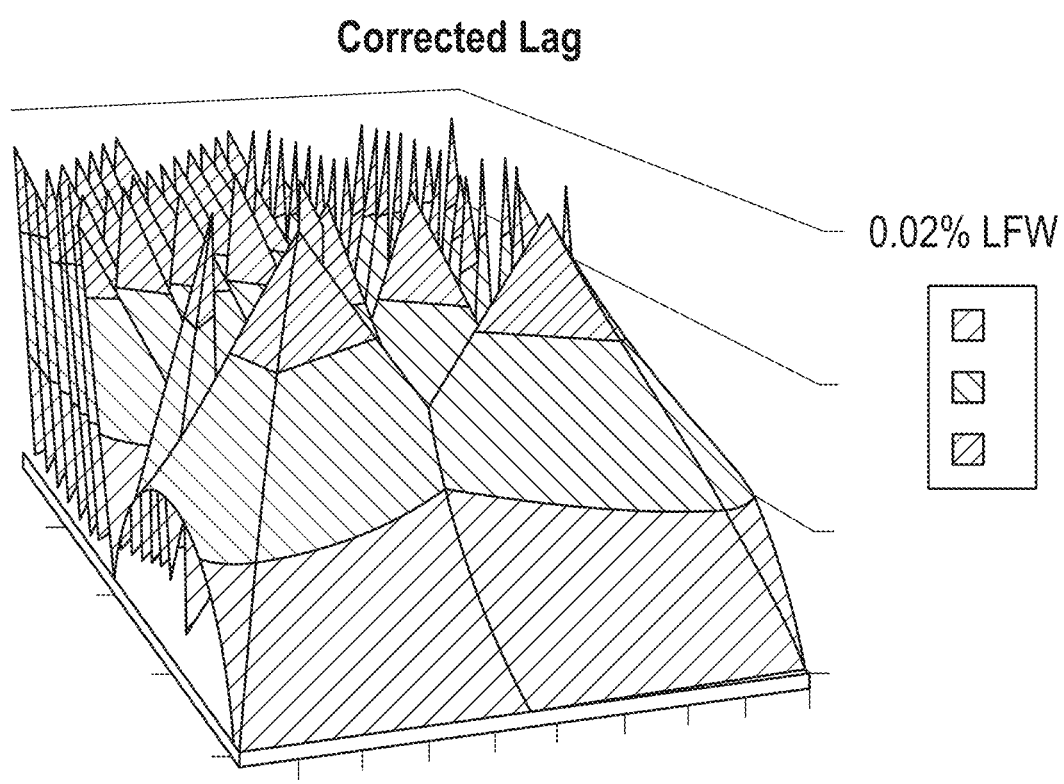
FIG. 13 is a three-dimensional graph of absolute corrected lag for the image of FIG. 11.

FIG. 11 is an image where lag has been corrected with a second correction and with a dynamic range of 0 to 0.33% LFW and FIG. 12 is an image where lag has been corrected with a second correction and with a dynamic range of 0 to 0.33% LFW and with dithering and $T_N$ applied. FIG. 13 shows a three-dimensional graph of absolute corrected lag for the images of FIG. 11. The images and the graphs show that the effect of dithering visibly helps create additional uniformity across the entire image (frame) using the lag cancellation method implementation. Again, for ease of illustration the contrast or dynamic range in FIGS. 11 and 12 was increased 300-fold, i.e., by 50 dB, with respect to FIG. 4.)

Figure 14:
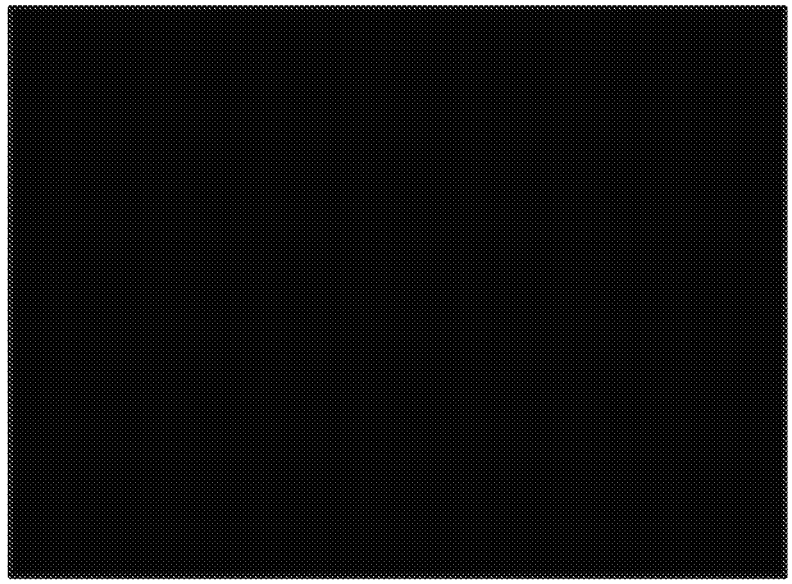
FIG. 14 is an image with a third corrected signal lag with a dynamic range corresponding to 0 to 0.33% of LFW.
Figure 15:
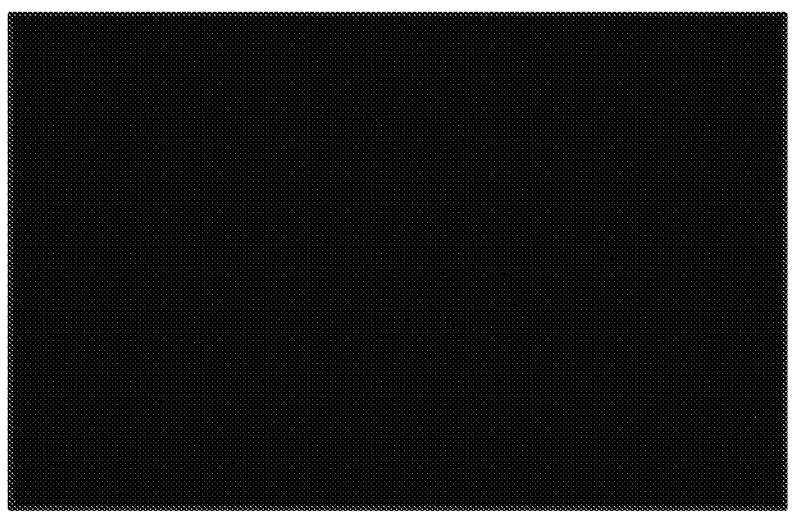
FIG. 15 is an image with a third corrected signal lag with a dynamic range corresponding to 0 to 0.33% of LFW and with random temporal noise and dithering applied.
Figure 16:
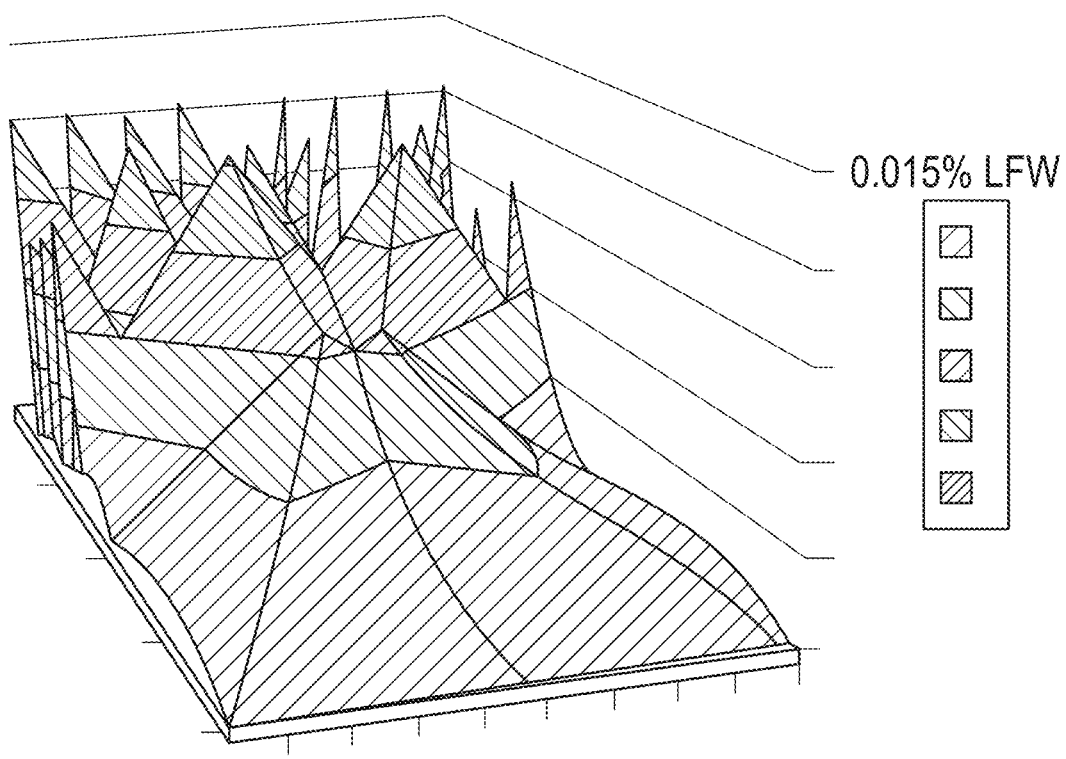
FIG. 16 is a three-dimensional graph of absolute corrected lag for the image of FIG. 14.

FIG. 14 is an image where lag has been corrected with a third correction and with a dynamic range of 0 to 0.33% LFW and FIG. 15 is an image where lag has been corrected with a third correction and with a dynamic range of 0 to 0.33% LFW and with dithering and $T_N$ applied. FIG. 16 is a three-dimensional graph of the absolute lag for the image of FIG. 14. Here the uniformity of the images and the graphs is even better than in FIGS. 11 and 12, further demonstrating the effect of increasing the number of bits used for correction. This difference is best observed by noting the difference in the visual look of each of the images of FIGS. 11, 12, 14, and 15 compared to each other as the number of bits used for correction is increased.

Figure 17:
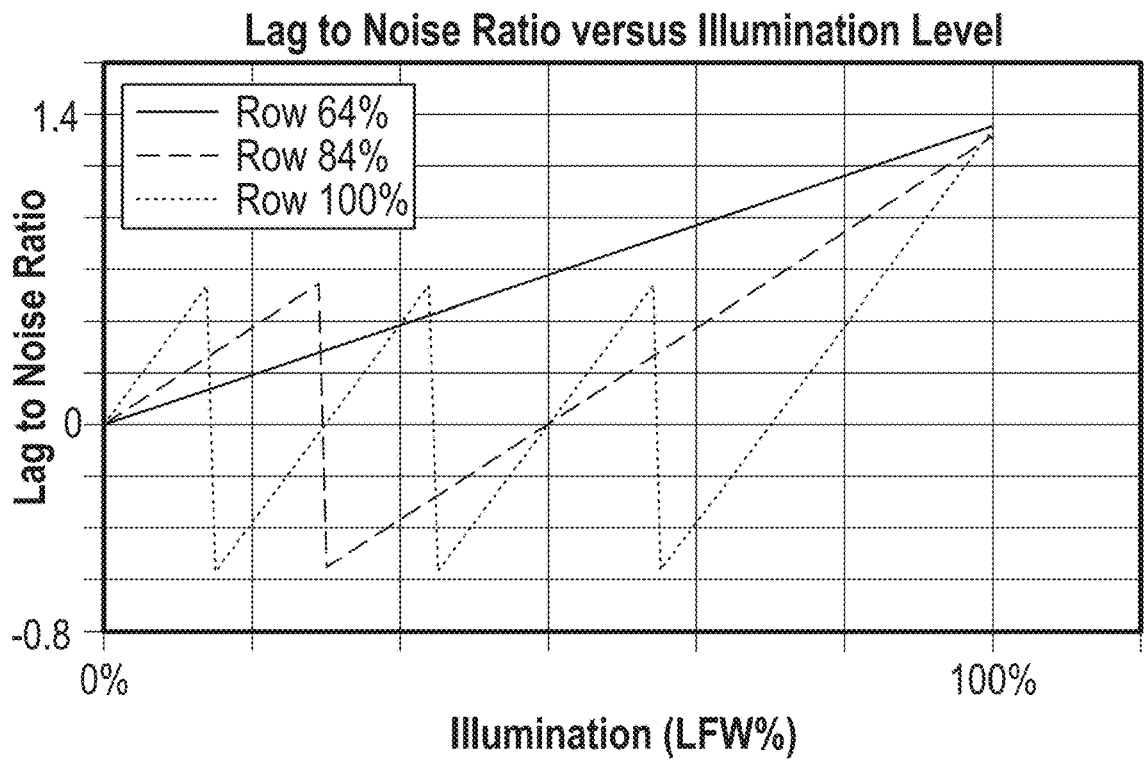
FIG. 17 is a graph of a first corrected lag signal ratio to $T_N$ for input illumination varying from 0 to 100% of LFW for three different percentage locations in a frame.
Figure 18:
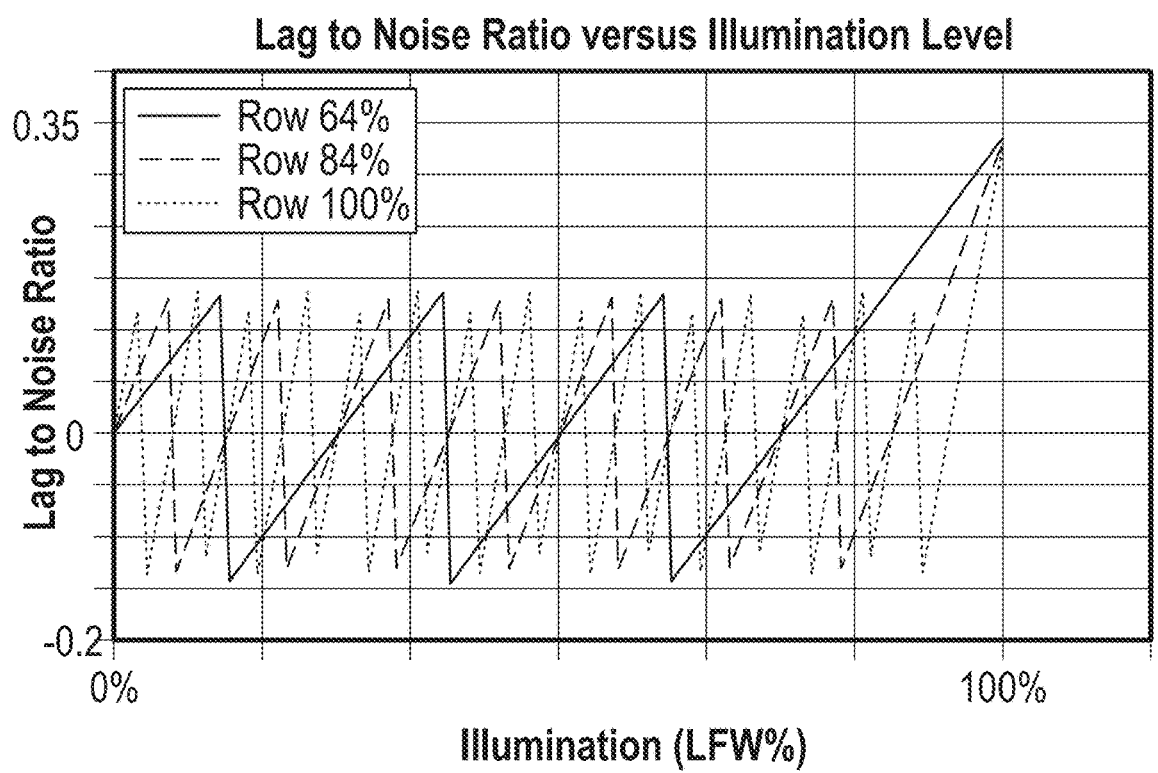
FIG. 18 is a second graph of a second corrected lag signal ratio to $T_N$ for input illumination varying from 0 to 100% of LFW for three different percentage locations in a frame.
Figure 19:
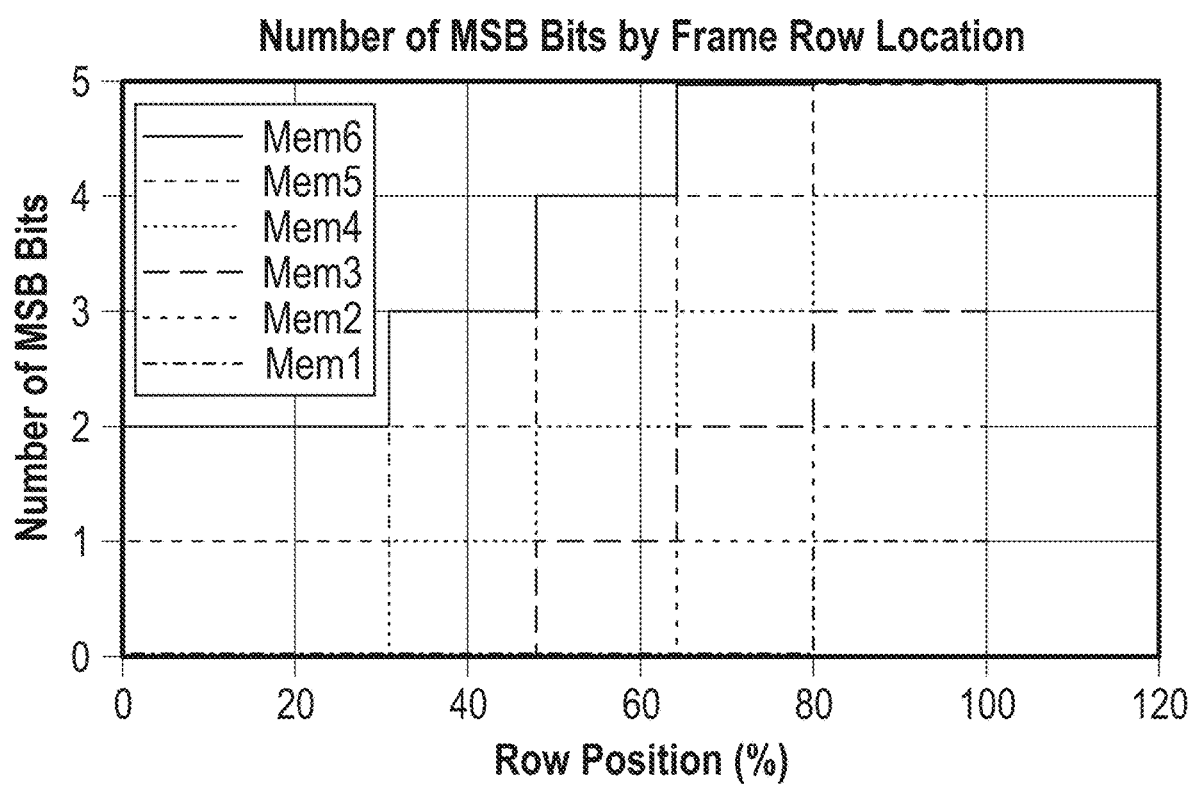
FIG. 19 is a graph of an example optimum number of most significant bits (MSB) used for lag correction by percentage row position in a frame.

With respect to the methods of truncation disclosed herein, FIG. 17 a graph of a first corrected lag signal ratio to $T_N$ for input illumination varying from 0 to 100% of LFW for three different percentage locations in a frame. FIG. 18 is a second graph of a second corrected lag signal ratio to $T_N$ for input illumination varying from 0 to 100% of LFW for three different percentage locations in a frame. FIG. 19 is a graph of an example optimum number of most significant bits (MSB) used for lag correction by percentage row position in a frame.

The foregoing graphs demonstrate that the method implementation has the effect of mitigating lag in a way that does not involve higher power consumption through increasing frame reset percentages. In this way, the use of the method implementations herein may successfully substantially reduce lag frame-to-frame even when high frame rates are being utilized.

While in the foregoing method and system examples have been described where the operating condition between each frame is constant, this is not the only operating condition in which the system and method implementations disclosed herein may be employed. In situations where a different set of operating conditions exists between successive frames, the system and method implementations disclosed herein may be used to vary various parameters, such as, by non-limiting example, integration time, frame rate, or another parameter known to compensate or adjust for the varying operating condition. In some implementations, where a long integration time is followed by a short integration time for the same illumination level of the array, the lag observed in the second (short integration time) will be relatively increased as a ratio to the second integration time by the ratio of the first and second integration times. This lag effect can be corrected in using the method implementations disclosed herein by increasing the correction term by the inverse ratio of the first and second integration times.

In another implementation, where the operating conditions involve alternating between high and low frame repetitions then the shortest duration rest would be used to calculate the scaling factor(s) used in the method implementations disclosed herein. In various method and system implementations, the memory requirement and associated power for processing can be dynamically optimized for the slow repetition frame.

In other implementations, some image sensors may operate with a reduced number of actual rows referred to as reading a region of interest (ROII). This ROI becomes a subset of the total number of rows in the array. In such method and system implementations, the various method implementations disclosed herein can be applied directly to the reduced array size being read (the ROI) including factoring in any higher frame rate associated with the region of interest read. In such implementations the memory utilized in the system implementations can be dynamically reallocated for the ROI read. For example, where a full frame has N memory bytes, the ROI read may be ¼ (or less) of the full array size, allowing for four times more memory to be available in the N memory bytes for use in processing the reduced array. As the method and system implementations disclosed herein demonstrate that the use of more memory results in better correction for the same frame rate or higher frame rate for the same level of correction, it is possible to obtain better correction for the ROI than for the full frame due to the increase in memory available for processing.

In places where the description above refers to particular implementations of systems and method for mitigating lag and implementing components, sub-components, methods and sub-methods, it should be readily apparent that a number of modifications may be made without departing from the spirit thereof and that these implementations, implementing components, sub-components, methods and sub-methods may be applied to other systems and methods for mitigating lag.

What is claimed is:

1. A method of mitigating lag for an image sensor device, the method comprising:
    reading a row of data from an Nth frame of image data from an image sensor device;
    correcting the row of data using truncated row data from an N−1th frame stored in a memory operatively coupled with the image sensor device to form a lag corrected row of data;
    outputting the lag corrected row of data;
    truncating the row of data to form truncated row data from the Nth frame; and
    storing the truncated row data from the Nth frame in the memory.

2. The method of claim 1, further comprising applying dithering to the row of data before truncating the row of data.

3. The method of claim 2, further comprising performing raw pixel data processing with the row of data.

4. The method of claim 1, wherein scaling the row of data using the truncated row data from the N−1th frame further comprises subtracting the truncated row data from the N−1th frame from the row of data.

5. The method of claim 1, wherein scaling the row of data using the truncated row data from the N−1th frame further comprises scaling the truncated row data from the N−1th frame using a reset duration and frame rate.

6. The method of claim 5, further applying dithering to the truncated row data.

7. The method of claim 1, wherein truncating the row of data further comprises truncating using a truncating number based on a value for a group of pixels.

8. The method of claim 7, further comprising multiplying the value for the group of pixels by $2^i$ where i is an integer greater than zero.

9. A method of mitigating lag for an image sensor device, the method comprising:
reading a row of data from an Nth frame of image data from an image sensor device;
performing raw pixel data processing to the row of data;
reading a truncated row of data from an N−1th frame of image data from a memory operatively coupled with the image sensor device;
scaling the truncated row of data using reset duration and frame rate to form a scaled truncated row of data;
subtracting the scaled truncated row of data from the row of data to form lag corrected row data;
outputting the lag corrected row of data;
truncating the row of data to form truncated row data from the Nth frame; and
storing the truncated row data from the Nth frame in the memory.

10. The method of claim 9, wherein the row of data in Nth frame has a row number that is the same as a row number of the truncated row of data from the N−1th frame.

11. The method of claim 9, wherein truncating the row of data further comprises truncating the row of data's least significant bits using a position of the row in the Nth frame and a desired lag correction.

12. The method of claim 9, further comprising applying dithering to the row of data before truncating the row of data.

13. The method of claim 9, further comprising applying dithering to the truncated row data after scaling the truncated row of data.

14. The method of claim 9, wherein truncating the row of data further comprises truncating using a truncating number based on a value for a group of pixels.

15. The method of claim 14, further comprising multiplying the value for the group of pixels by $2^i$ where i is an integer greater than zero.

16. The method of claim 9, wherein truncating the row of data to form truncated row data from the Nth frame further comprising truncating until residual most significant bits by row position equal zero.

17. A method of mitigating lag for an image sensor device, the method comprising:
setting a row number to zero for a first frame of image data;
reading a row of data from the first frame of image data from an image sensor device;
performing raw pixel data processing to the row of data;
truncating the row of data to form truncated row data from the first frame; and
storing the truncated row data from the first frame in a memory operatively coupled with the image sensor device.

18. The method of claim 17, further comprising, for a second frame:
reading a row of data from the second frame of image data;
performing raw pixel data processing to the row of data;
reading the truncated row of data from the first frame of image data from the memory;
scaling the truncated row of data using reset duration and frame rate to form a scaled truncated row of data;
subtracting the scaled truncated row of data from the row of data from the second frame of image data to form lag corrected row data;
outputting the lag corrected row of data;
truncating the row of data to form truncated row data from the second frame; and
storing the truncated row data from the second frame in the memory.

19. The method of claim 18, further comprising repeating for all rows in the second frame of image data.

20. The method of claim 17, further comprising repeating for all rows in the first frame of image data except for setting the row number to zero for the first frame.

* * * * *